Figure 1:
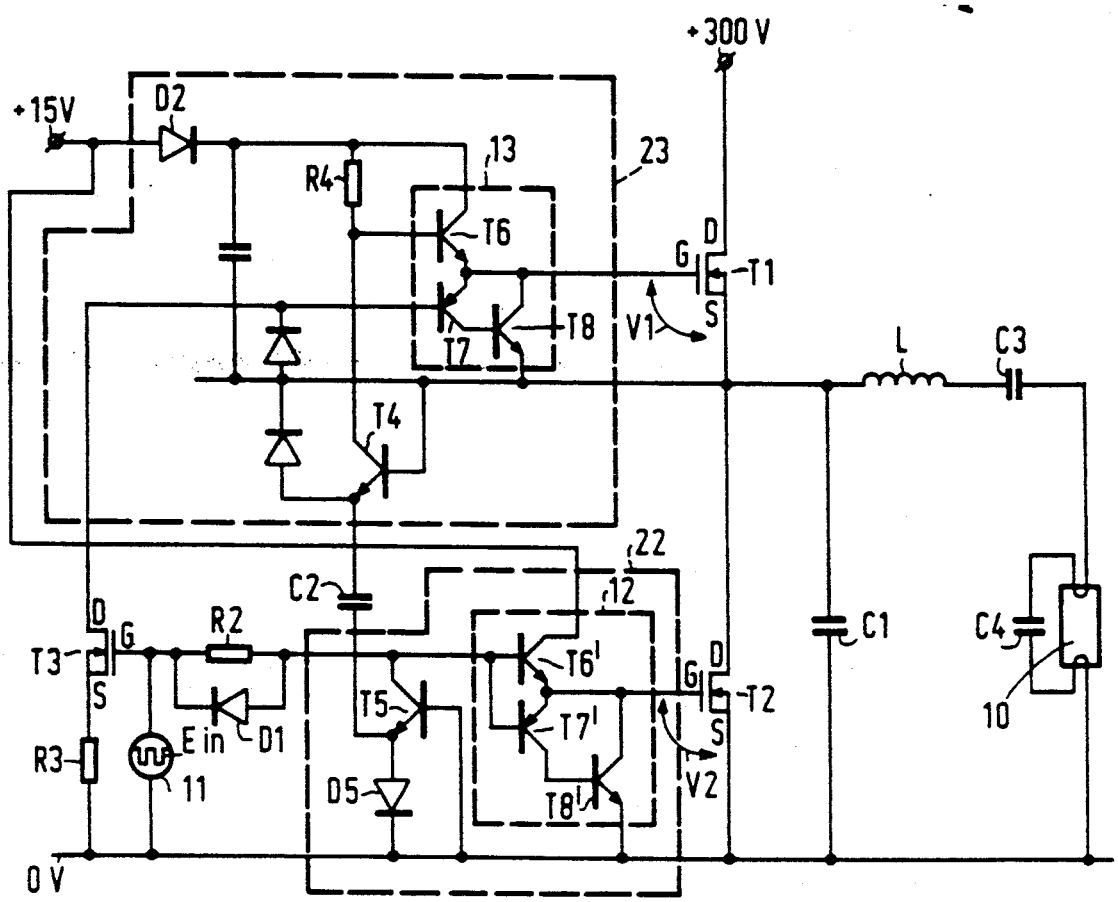

United States Patent

Schoofs

[11] Patent Number: 5,068,571
[45] Date of Patent: Nov. 26, 1991

[54] SWITCHED BRIDGE CIRCUIT

[75] Inventor: Franciscus A. C. M. Schoofs, Eindhoven, Netherlands

[73] Assignee: U.S. Philips Corporation, New York, N.Y.

[21] Appl. No.: 553,476

[22] Filed: Jul. 13, 1990

[30] Foreign Application Priority Data

Jul. 19, 1989 [GB] United Kingdom ............... 8916451

[51] Int. Cl.[5] ................................................ H05B 41/14
[52] U.S. Cl. ................................. 315/205; 315/209 R; 315/225; 315/DIG. 7; 331/113 A
[58] Field of Search .............. 315/205, 209, 225, 226, 315/240, DIG. 7; 363/56; 331/113 A; 328/8

[56] References Cited

U.S. PATENT DOCUMENTS

| | | | |
|---|---|---|---|
| 3,758,841 | 9/1973 | Bourbeau | 331/113 A |
| 4,099,225 | 7/1978 | Nygaard | 363/56 |
| 4,706,177 | 11/1987 | Josephson | 363/56 |
| 4,731,721 | 3/1988 | Igashira et al. | 363/56 |
| 4,829,415 | 5/1989 | Haferl | 363/56 |

*Primary Examiner*—Eugene R. LaRoche
*Assistant Examiner*—Son Dinh

[57] ABSTRACT

A switched bridge circuit has semiconductor bridge elements (T1,T2) which are arranged to provide a commutated output from a d.c. source (+300V). The commutation is effected by a switching signal from a control circuit. The control circuit for switching the bridge elements is coupled with the output by a capacitor (C2) such that switching of the bridge elements is prevented while there is a flow of current through the capacitor, the current through the capacitor is indicative of a changing output voltage and a confirmation that the voltage across the bridge elements is not approximately zero or +300V.

24 Claims, 6 Drawing Sheets

SWITCHED BRIDGE CIRCUIT

This invention relates to a semiconductor switched bridge circuit having a protection against switching of a semiconductor element on the bridge whilst there is a significant voltage across it.

A known way of protecting the semiconductor switches of a switched bridge circuit is to compare the output voltage or a proportion of the output with a reference voltage and to feed back the result of this comparison to a control circuit. Such an arrangement works satisfactorily but in the case of high voltages such as rectified a.c. mains voltages a high impedance resistor is required to reduce the voltage to a value suitable for comparison in a semiconductor circuit. Such resistors are not easy to fabricate as part of an integrated circuit in view of the large surface area required in addition it is necessary to sense when the output is zero and when it is at supply voltage. In addition there are sometimes requirements for more complex controls.

In bridge circuits such as are used in electronic ballasts for miniature fluorescent lamps driven from a rectified a.c. mains supply, the bridge circuit has to feed an inductive load and very steep voltage surges can appear on the output, for example 300 V in 50 n secs, during commutation giving rise to radio interference and additional dissipation because the semiconductor switches cannot turn off sufficiently quickly. One way of reducing this high slew rate is to include a capacitor in parallel with the load which thereby reduces the rate of change of voltage with time. However, this introduces a further problem in that the bridge circuit control can cause destruction of the semiconductor elements in the bridge if switching can occur when there is a significant voltage across them.

The present invention has resulted from a consideration of this problem and seeks to provide a switched bridge circuit with a control which is switched only when the voltage across the semiconductor element is low. The timing of this is critical and depends on external factors such as the operating frequency and values of non integrable components and the supply voltage.

According to the invention there is provided a switched bridge circuit in which semiconductor bridge elements are arranged to provide a commutated output voltage from a d.c. supply source in response to a switching signal, characterised in that a control circuit for switching the bridge elements is coupled with the output by a capacitor such that switching of the bridge elements is prevented whilst there is a flow of current through the capacitor, which is indicative of changing output voltage.

The capacitor is effectively monitoring slew rate and , except at start up, if this is 0 as is signified by no current through the capacitor then one of the requirements for permitting switching of the bridge elements that the output voltage is 0 or V supply is met.

The control circuit may comprise a first transistor which has its base electrode coupled with the output its emitter electrode coupled via said capacitor to the emitter of a second transistor and its collector coupled with one of a pair of d.c. voltage supply lines via a first resistor and to the control electrode of a semiconductor element in one arm of the bridge, and in which the base of the second transistor is coupled to the other of said pair of d.c. supply lines and the collector is coupled with the control electrode of a semiconductor element in the other arm of the bridge, the collector of the first transistor is coupled via the drain/source path of a field effect transistor and a second resistor to said other d.c. supply line, the gate electrode of the field effect transistor is coupled to a switching signal line for receiving said switching signal which line is coupled via a third resistor with the collector of the second transistor.

An oscillator circuit may be connected in circuit to provide the switching signal for effecting commutation.

The first and second transistors may each be provided with a diode connected between their base and emitter so as to be reverse biased when the transistor is conductive.

The collector of the first and second transistors may be coupled each with their different semiconductor elements in their particular arm of the bridge via a d.c. amplifier.

In an advantageous arrangement the d.c. amplifiers each comprise a fourth transistor of one conductivity type and a fifth transistor of the opposite conductivity type having their bases coupled with the collector of one of the first and second transistors respectively, the emitter electrode of which fourth transistor is coupled to the emitter electrode of the fifth transistor and to the control electrode of the semiconductor element in their particular arm of the bridge and a sixth transistor of said first conductivity type having its base coupled with the collector of the fifth transistor, and its collector emitter path connected in parallel with one of the bridge elements.

The circuit may be conveniently fabricated in a single integrated circuit chip.

According to another aspect of the invention there is provided an a.c. powered switched bridge circuit characterised in the combination of a voltage clamp coupled in parallel with a pair of input lines for a source of alternating current supply, a rectifier circuit coupled with the output of the voltage clamp and a switched bridge circuit as previously defined coupled with the output of the rectifier circuit.

According to a specific application of the invention there is provided a fluorescent lamp unit, characterised in the combination of a fluorescent tube and ballast and an a.c. powered switched bridge circuit as previously defined the bridge circuit of which is configured as a switched mode power converter which feeds the tube.

The voltage clamp, the rectifier circuit, the switched bridge circuit, the tube and ballast may all be incorporated in a lamp housing or all of these except the tube may be incorporated in a luminaire for receiving a miniature fluorescent tube. The lamp housing or luminaire may be adapted for removeable connection to a lamp socket such as is suitable for connection of an incandescent light bulb.

Figure 2:
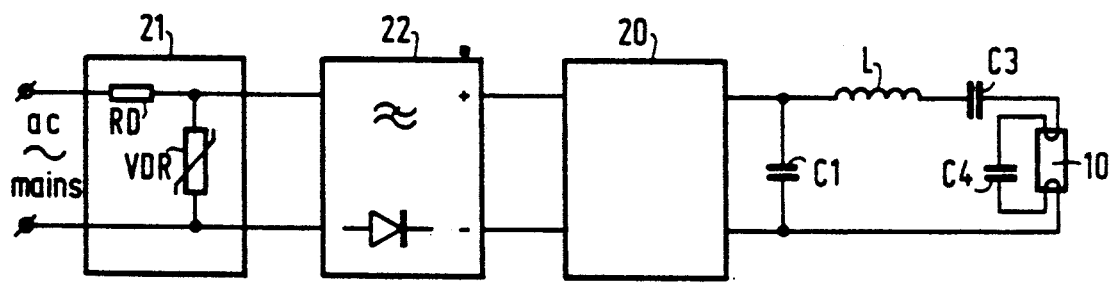
Figure 3:
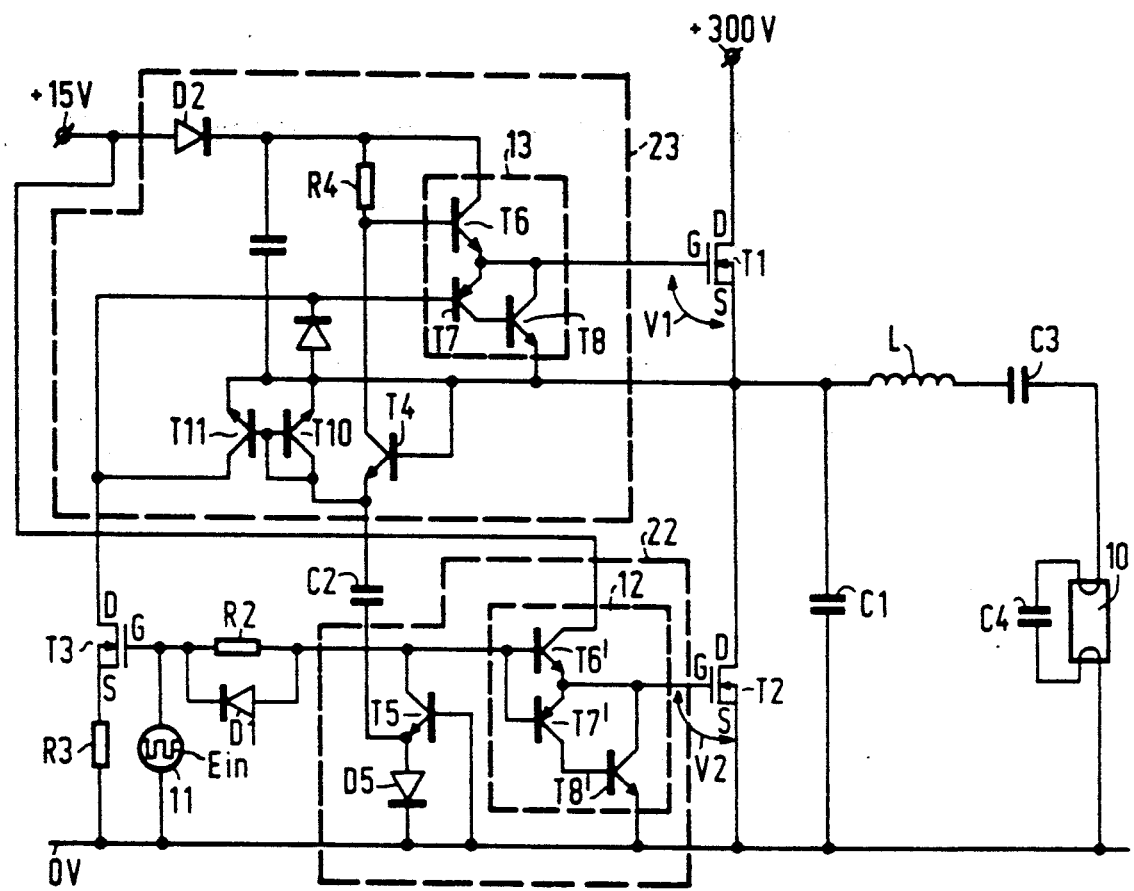
Figure 4:
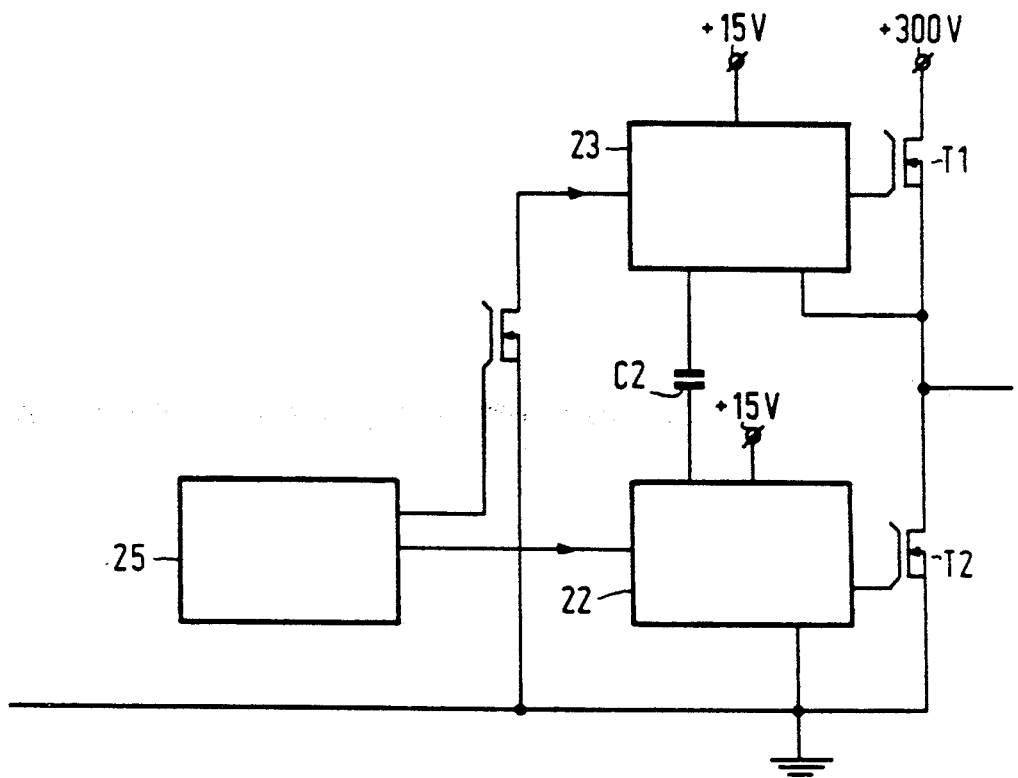
Figure 5:
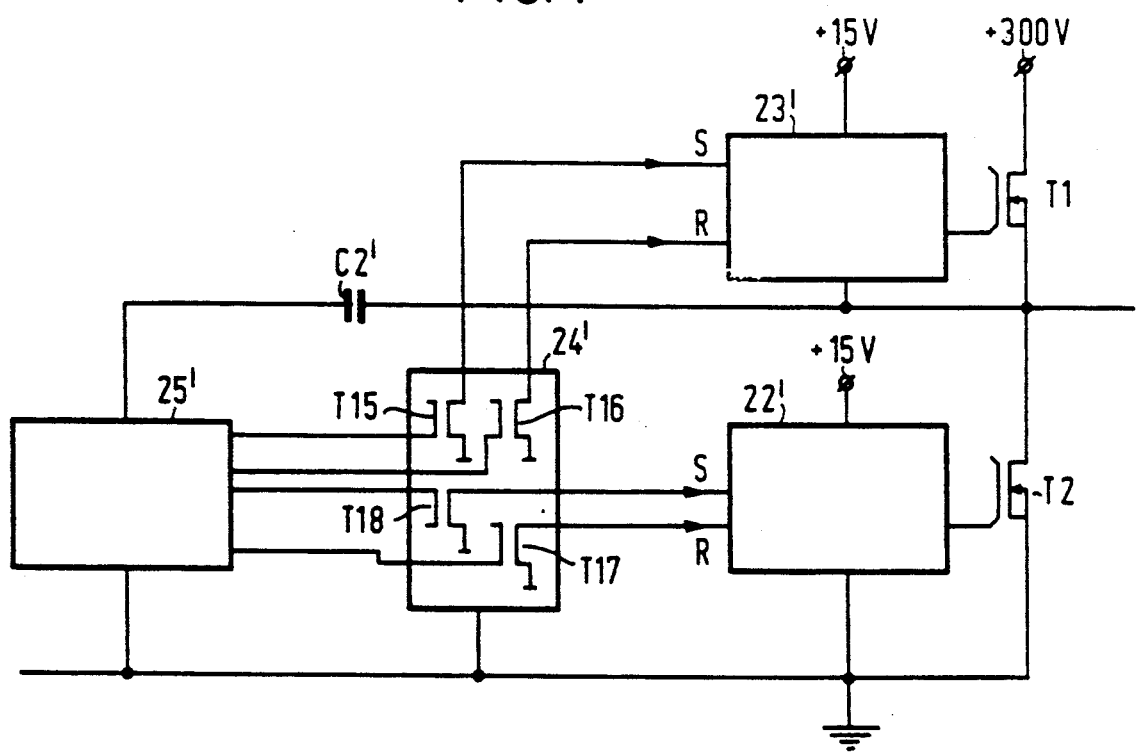
Figure 6:
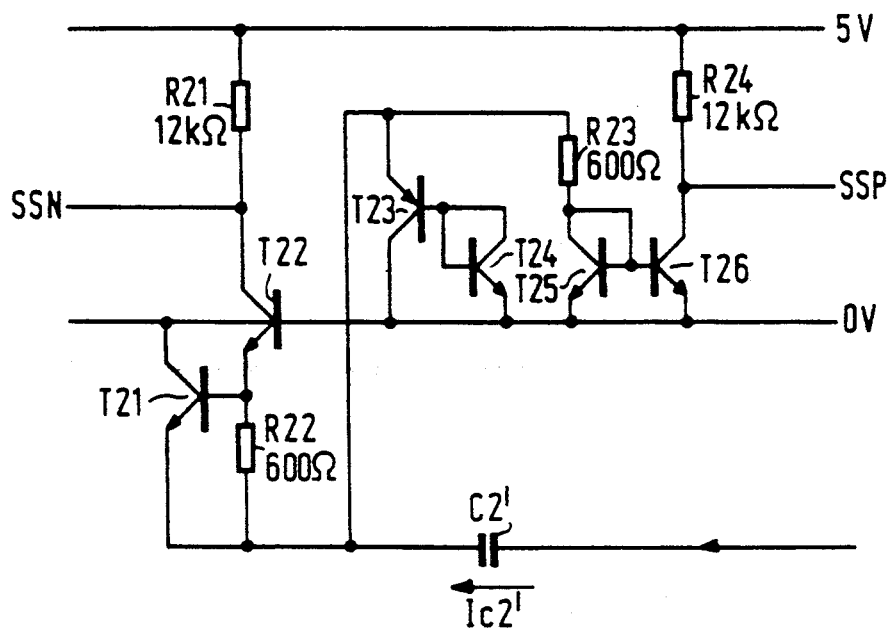
Figure 7:
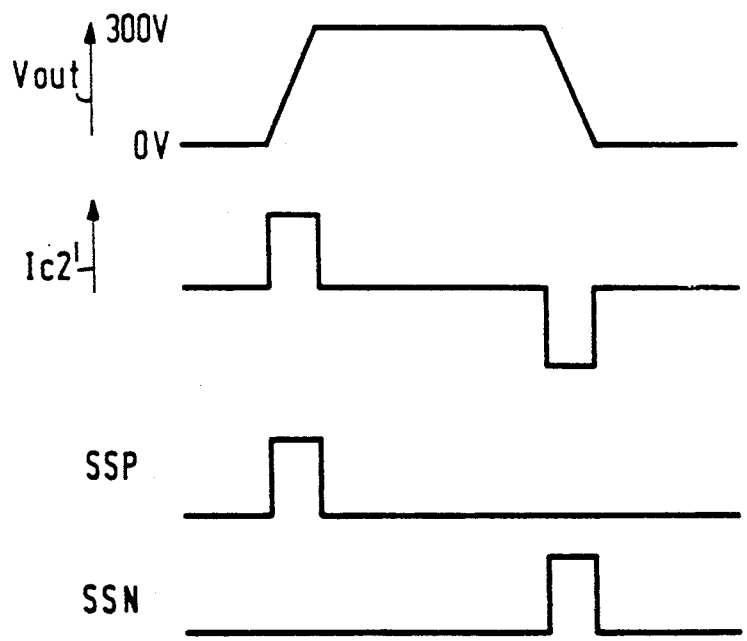
Figure 8:
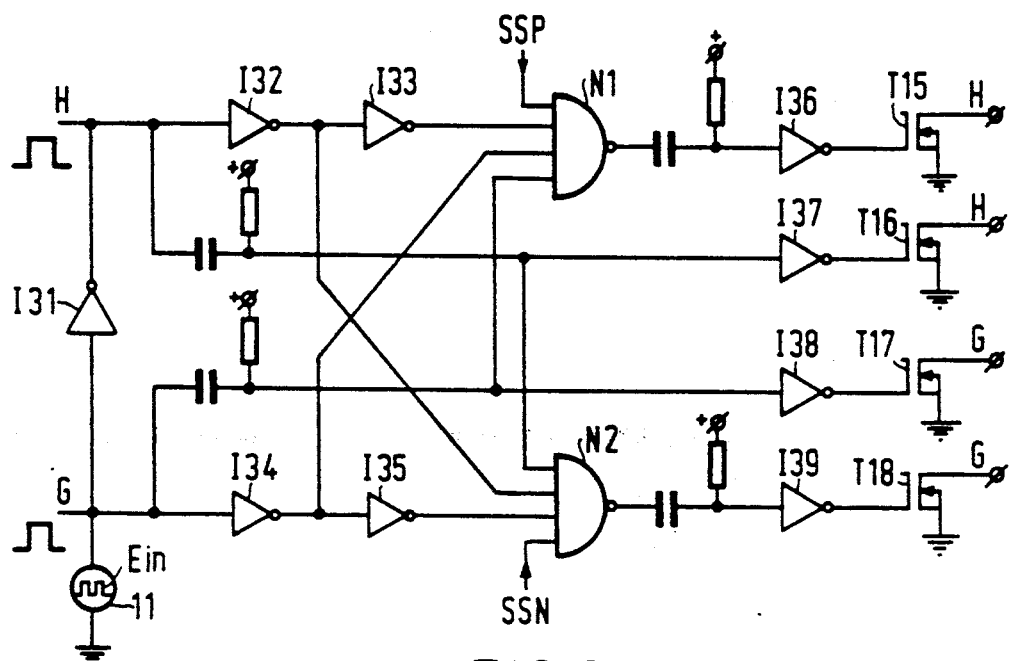
Figure 9:
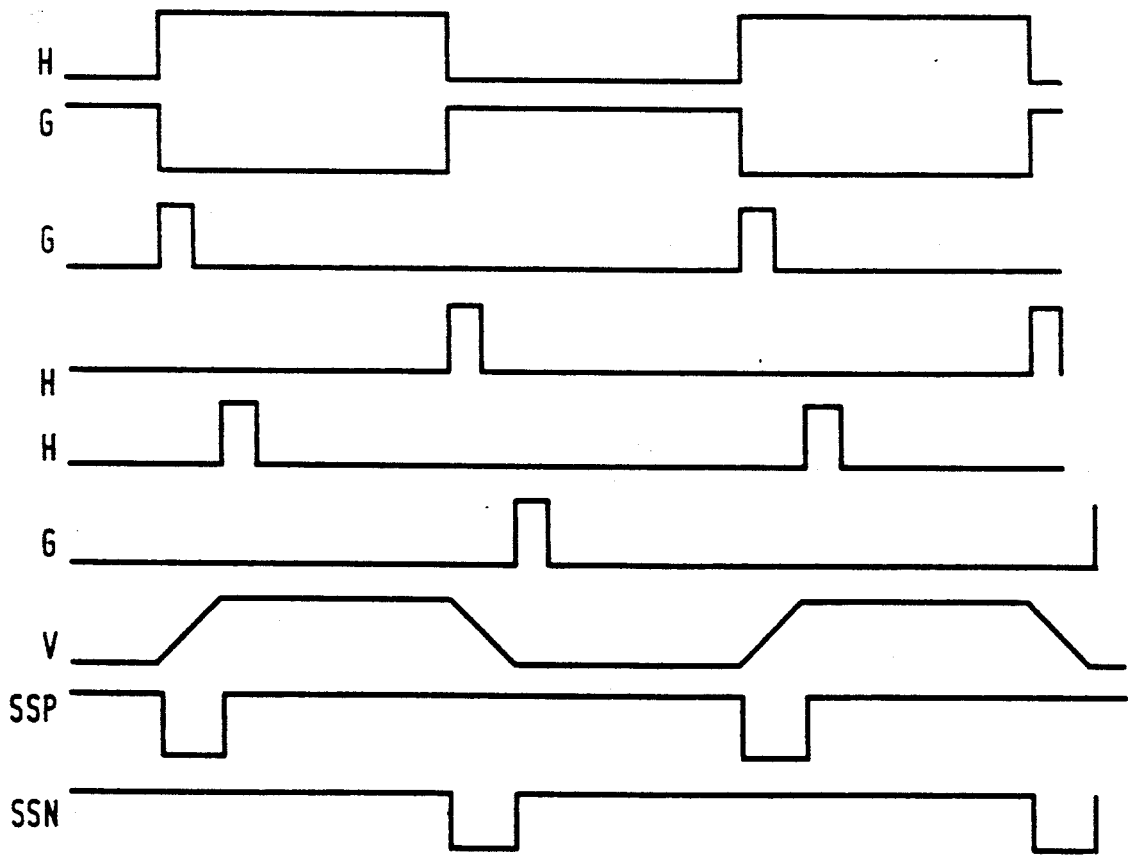
Figure 10:
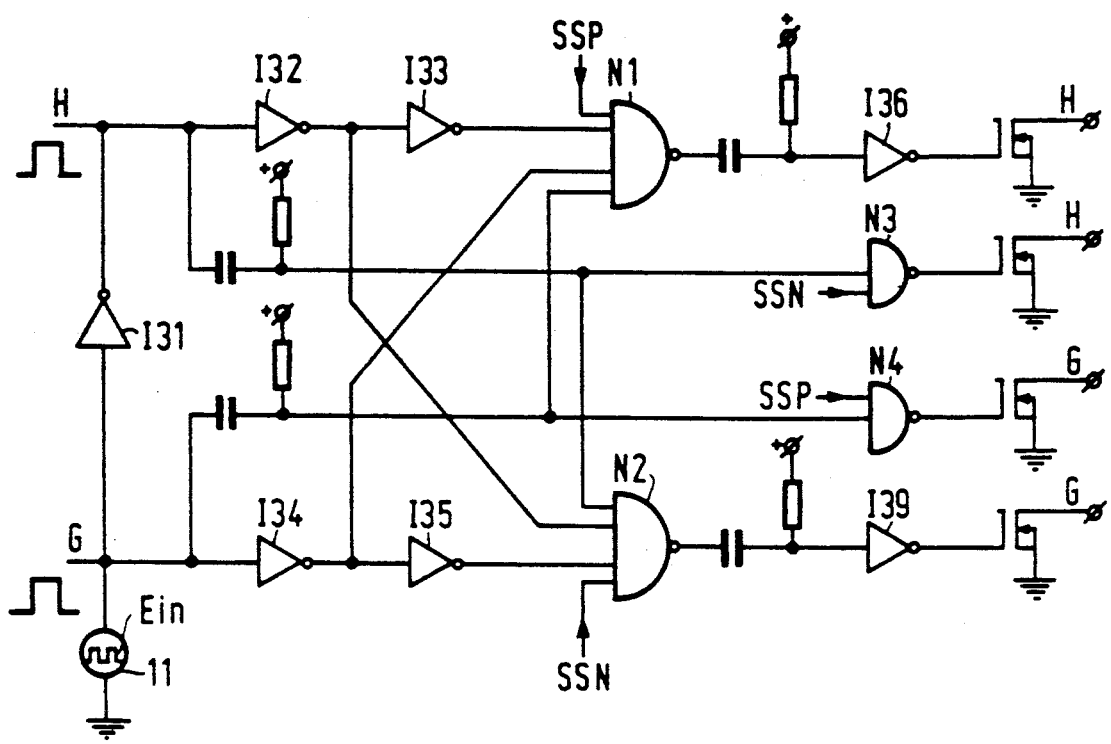

In order that the invention and its various other preferred features may be understood more easily, an embodiment thereof will now be described by way of example only, with reference to the drawings, in which:

FIG. 1 is a schematic circuit diagram of a switched bridge circuit constructed in accordance with the invention, FIG. 2 is a partial block schematic diagram of a fluorescent lamp unit incorporating a switched bridge circuit in accordance with the invention, FIG. 3 is a circuit diagram showing a second embodiment of switched bridge circuit constructed in accordance with the invention, FIG. 4 is a simplified block schematic drawing showing the basic blocks of FIGS. 1 & 3, FIG. 5 is a block schematic drawing showing a third embodiment of switched bridge circuit constructed in accordance with the invention, FIG. 6 is a detail circuit for converting capacitive current into digital signals which circuit is part of the embodiment of FIG. 5, FIG. 7 is a waveform diagram for illustrating the operation of the circuit of FIG. 6, FIG. 8 is a block schematic diagram showing in more detail part of the embodiment of FIG. 5, FIG. 9 is a waveform diagram for illustrating the operation of the circuit of FIG. 8, FIG. 10 is a block schematic diagram similar to FIG. 8 but incorporating a further refinement of the invention.

In the switched bridge circuit of FIG. 1 a semiconductor bridge comprises first and second field effect transistors T1 and T2 respectively the drain source paths of which are connected in series between a pair of 300 V d.c. supply lines. In the illustrated example the output from the bridge circuit, taken between the source/drain junction of transistors T1 and T2 respectively, feeds a load in the form of a miniature fluorescent lamp 10 via an inductor L and a capacitor C3. A capacitor C1 of 220 pF is connected across the output of the bridge to reduce the steep edges (300 V,30 nsecs) to 300 V, 300 nsec which result when the bridge is controlled by a square wave drive. The drive for the bridge is derived from a square wave generator 11 the output of which feeds a control circuit.

The control circuit comprises a resistor R2 of 39 K.Ohms fed from the generator 11 which resistor is connected to the input of a d.c. amplifier 12 the output of which is coupled with the gate of bridge transistor T2. A diode D1 is connected in parallel with the resistor R2. The control circuit also comprises a field effect transistor T3 the source of which is coupled via a resistor R3 of 2 K.Ohms to the zero voltage supply line of the circuit and the drain of which is coupled via a resistor R4 of 39 K.Ohms to a +15 volt supply line via a diode D2 and also to the input of a second d.c. amplifier 13 of the control circuit. The gate of the transistor T3 is coupled with the generator 11. The transistor T3 operates as an inverter and the bridge transistors are caused, by the outputs of the two d.c. amplifiers 12,13 of the control circuit, to conduct alternately in response to the square waveform supplied by the generator.

The control circuit incorporates a sensing circuit for determining when the rate of change of output voltage from the bridge is zero. This comprises an npn transistor T4 having its base connected to the bridge output, its emitter connected via a sensing capacitor C2 of 1 pF to the emitter of an npn transistor T5 and its collector connected via the 39 K.Ohm resistor R4 to the +15 V supply via the diode D2. The base of T5 is connected to the OV supply line and a diode D4,D5 is connected between the emitter and base of each of the transistors T4 and T5.

The circuit operation will now be described starting from the instant where bridge transistor T1 is conductive (ON) and T2 and T3 are non conductive (OFF) and the voltage, from the generator 11, E in=0. The output current to the load is 200 m.Amp. Now E in changes to 15 volts and the voltage V2 between gate and source of transistor T2 starts to rise towards 15 volts with a time constant determined by R2 and the parasitic capacitance of the circuit. T3 is immediately switched on, the voltage drop across R4 becomes 15 V so that the voltage input to amplifier 13 and its output is zero. Accordingly the voltage V1 between gate and source of transistor T1 is 0. The load discharges C1 and the same voltage appears across C2. Whilst current flows through C2 and through D4 and T5 on providing a zero voltage at the input of the amplifier 12 and V2 becomes 0. As soon as the output voltage is equal to 0 volts the current through C2 becomes zero, V2 becomes 15 volts and T2 is switched on. The current through the load then decreases to −200 mA, E in becomes 0 and T2 is switched off. A similar operation occurs for transistor T1, to ensure that this only switches when the voltage is zero, the transistors T1 and T2 being switched alternately.

In this simple way the sensing circuit effectively determines when the output voltage is zero and also determines, from the direction of current flow through it, which of the transistors T1 and T2 is to be switched on. For a load current of 200 mA, a slew rate reduction capacitor C1 of 220 pF and a 1 pF sensing capacitor C2 the current through the sensing capacitor is 900 μa which is adequate to derive a control voltage.

The fluorescent lamp unit of FIG. 2 incorporates a switched bridge circuit 20 as described in connection with FIG. 1 feeding a miniature fluorescent lamp 10, such as an SL or PL type, via a ballast circuit comprising a shunt capacitor C1 a series inductor L and series capacitor C3. The source of power is derived from the 240 V a.c. mains via a voltage clamp 21 comprising a series arrangement of a resistor RD and voltage dependant resistor VDR connected between the mains lines. The output of the voltage clamp developed across VDR is coupled via a filter and rectifier circuit 22 to the switched bridge circuit 20. The complete arrangement 20 can be fabricated as a single integrated chip and can be incorporated in the housing of a miniature fluorescent lamp or luminaire for receiving a fluorescent tube which lamp or luminaire may be adapted for removeable connection to a lamp socket such as is suitable for connection of an incandescent light bulb, e.g. a bayonett or screw fitting, for which it may form a replacement.

A refinement of the invention is shown in FIG. 3 the circuit of which is similar to FIG. 1 and employs the same reference numerals for similar parts. Here a current mirror is formed by two N P N transistors T10 and T11. The transistor T10 acts as a clamping diode and has its base and collector electrodes connected together, the base/collector electrodes being connected to the emitter electrode of the transistor T4 and to the base electrode of transistor T11, the emitter electrode of transistor T10 being connected to the output of the bridge and to the emitter of transistor T11. The collector electrode of the transistor T11 is connected to the drain electrode of the transistor T3 and to the input of amplifier 13 and to the collector of T4 thereby keeping the voltage low at the input of block 13. This prevents the risk of parasite capacitance to ground at the input to the amplifier 13 from turning on transistor T1 again if low current levels occur in T3.

The circuits of FIGS. 1 and 3 have portions 22 and 23 enclosed in dotted line boxes and a simplified block schematic is illustrated in FIG. 4 to aid illustration of some further embodiments of the invention.

Referring now to FIG. 5 a third embodiment of the invention has latches 23', 22' which may be substantially similar to 22 and 23 of the previous circuits but with a latching capability. The latches 22', 23' each have a set and reset input driven by a respective transistor in block 24' in response to control signals derived from low voltage control part 25' which is explained in detail in connection with FIGS. 6 to 8. A sensing capacitor C2' is this time connected between the bridge output and an input to the low voltage control part 25' which latter is effective to set and reset the latches 23' and 22' alternately when there is no current flow in the capacitor C2' and the bridge output is zero. In this way the current through C2 (during slewing of the output signal) can be converted into a signal which can delay the turn on pulse of T1, T2 as long as the output is slewing. The manner in which this determination occurs will now be described in connection with FIGS. 6, 7 and 8.

The circuit of FIG. 6 and its associated waveform diagrams shown in FIG. 7 illustrate one way in which the current through C2' can be converted into digital signals SSN and SSP which are used in the control of the latches 22', 23'. If we consider a bridge output signal which goes negative, then T22 is switched on, current flowing through R22 causes a switch on voltage to be developed on the base electrode of T21 the current through R22 is limited to V diode/600 Ω, where V diode is the base emitter voltage of T21, and excess current flows through T21 to the 0 volt rail. The voltage on the collector electrode of T22 falls and the output SSN is low. In these circumstances T23, T24, T25 and T26 are non conductive, the voltage on the collector of T26 is 5 V. When the bridge output signal goes positive T23 conducts clamping the voltage on the emitter of T23 to 2. V diode being the diode voltages of T23 and T24. Current flow through R23 is limited to V diode/600 Ω and excess current flows to the OV rail via T23 and T24. Conduction of T26 results and the current through R24 causes the voltage to fall and the output SSP becomes low. In these circumstances T21 and T22 are non conductive, the voltage on the collector of T22 SSN is high. This operation may be appreciated by reference to the waveform diagrams of FIG. 7.

Referring now to FIG. 8 there is illustrated a logic circuit, forming part of block 25' of FIG. 5, for providing output on and off pulses to both of the latch circuits 22', 23' such that off pulses have preference and have as little as possible delay. The generator 11 provides drive pulses G and, via an inverter I31, also drive pulses H. To ensure priority of the OFF pulses and to avoid glitches, two series inverters I32, I33 and I34, I35 couple the H or G pulses to one input of a four input NAND GATE N1 or N2 thereby introducing delay of the ON pulse. The output of each of the NAND gates is coupled via a capacitor resistor differentiating circuit, which converts the output to short pulses, and an inverter I36, I39 to a different one of the drive transistors T15, T18. The H and G pulses are also each connected via capacitive resistive differentiating circuits and inverter I37, I38 to a different one of the drive transistors T17, T16 to provide the OFF pulse. Alternative circuits then provide an effective differentiating function by converting a step function to a short pulse can be employed instead of a capacitive resistive circuit and such circuits are intended to fall within the term differentiating circuit. Examples of such circuits are a monostable multivibrator or a dual input NAND gate having one input fed by the signal direct and the other input fed via a delay circuit e.g. on odd number of inverters. The signal occurring between the two inverters I32, I33 and I34, I35 for driving each latch circuit is coupled to an input of the NAND gates N2 and N1 respectively and the signal occurring on the OFF PULSE side prior to the input to inverters I37, I38 is also coupled to another input of the NAND gates N2 and N1 respectively. These cross connections ensure that the latches are always oppositely controlled such that when one is on the other is off.

A further input to the NAND gates N1 and N2 is provided from the SSP and SSN outputs of FIG. 6 respectively, providing the slew sense signals indicative of whether the output voltage is positive or negative going. The inverters I21, I22 can be omitted in which case the N1 input should be connected to the collector electrode of T22 and the N2 input should be connected to the collector electrode of transistor T26.

The operation of the logic diagram of FIG. 8 can be better understood by reference to the waveform diagram of FIG. 9.

A further refinement of the logic of FIG. 8 is shown in FIG. 10 where similar parts are given similar reference numerals. In this arrangement dual input NAND gates N3 and N4 have been substituted for inverters I37 and I38 the additional input of which is coupled to SSN and SSP respectively. With this arrangement the off pulses are continued as long as the bridge output voltage is slewing thereby improving the slew rate insensitivity of the system.

The elements employed are particularly suitable for fabrication on an integrated circuit chip. The entire control circuit may be fabricated as a single integrated circuit chip which may also include the bridge elements and/or the generator 11.

It will be appreciated that although the circuit has been described employing semiconductors of one conductivity type, a similar circuit can be produced employing transistors of the opposite conductivity type without departing from the scope of this invention.

It will be appreciated that the switched bridge circuit of this invention has diverse applications for example:
Electronic bridge circuit suitable for providing a primary voltage for ferrite transformers,
Control electronics for discrete transistors of high power motors,
Shavers,
Chargers for batteries e.g. in nickle cadmiun rechargeable devices.

I claim:

1. A switched bridge circuit in which semiconductor bridge elements (T1,T2) are arranged to provide a commutated output voltage from a d.c. supply source in response to a switching signal, characterised in that a control circuit for switching the bridge elements has its output connected to a capacitor (C2) such that switching of the bridge elements (T1,T2) is prevented whilst there is a flow of current through the capacitor (C2), which is indicative of changing output voltage.

2. A circuit as claimed in claim 1, characterised in that the control circuit comprises a first transistor (T4) which has its base electrode coupled with the output its emitter electrode coupled via said capacitor (C2) to the emitter of a second transistor (T5) and its collector coupled with one of a pair of d.c. voltage supply lines (15 v) via a first resistor (R4) and a diode (D2), and to the control electrode (G) of a semiconductor element (T1) in one arm of the bridge, and in which the base of the second transistor (T5) is coupled to the other (0 V) of said pair of d.c. supply lines and the collector is coupled with the control electrode (G) of a semiconductor element (T2) in the other arm of the bridge, the collector of the first transistor is coupled via the drain/source path of a field effect transistor (T3) and a second resistor (R3) to said other d.c. supply line (OV), the gate electrode (G) of the field effect transistor (T3) is coupled to a switching signal line for receiving said switching signal which line is coupled via a third resistor (R2) with the collector of the second transistor (T5).

3. A circuit as claimed in claim 2, characterised in that the first (T4) and second (T5) transistors are each provided with a diode (D4,D5) connected between their base and emitter so as to be reverse biased when the transistor is conductive.

4. A circuit as claimed in claim 2, characterised in that a diode (T10) is connected between the emitter of the first transistor (T4) and the output and a third transistor (T11) has its base electrode coupled with the emitter electrode of the first transistor (T4) its emitter electrode coupled with the output and its collector electrode coupled with the drain of the field effect transistor.

5. A circuit as claimed in claim 2, 3 or 4, characterised in that an oscillator (11) is connected in circuit to provide the switching signal for effecting commutation.

6. A circuit as claimed in claim 5, characterised in that the collector of the first and second transistors (T4,T5) are coupled each with their different semiconductor elements in their particular arm of the bridge via a d.c. amplifier (12,13).

7. A circuit as claimed in claim 6, characterised in that the d.c. amplifiers (T12,T13) each comprise a fourth transistor (T6,T6') of one conductivity type and a fifth transistor (T7,T7') of the opposite conductivity type having their bases coupled with the collector of one of the first and second transistors (T4,T5 respectively), the emitter electrode of which fourth transistor (T6,T6') is coupled to the emitter electrode of the fifth transistor (T7,T7') and to the control electrode (G) of the semiconductor element (T1,T2) in their particular arm of the bridge and a sixth transistor(T8,T8') of said first conductivity type having its base coupled with the collector of the fifth transistor (T7,T7'), and its collector emitter path connected in parallel with one of the bridge elements (T1, T2).

8. A circuit as claimed in claim 1, characterised in that the bridge elements (T1, T2) are driven by latching circuits (22',23') which are set and reset alternately when there is no flow of current through the capacitor.

9. A circuit as claimed in claim 8, characterised in that the latches are set and reset by a logic circuit which is responsive to a control circuit in dependance upon the direction of current through the capacitor.

10. A circuit as claimed in claim 9, characterised in that the logic circuit comprises first and second NAND gates (N2, N1), the first NAND gate (N2) has a first input coupled with an input for the switching signal, a second input connected with the control circuit and an output coupled with the set or reset input of a first one of the latching circuits (22'), the other reset or set input of the first latching circuit is connected with the input via an inverter, the second NAND gate has a first input coupled via an inverter (I31) with the input for the switching signal a second input connected with the control circuit and an output coupled with the set or reset input of the second one of the latching circuits (23') and the other reset or set input of the second latching circuit is connected with the inverted switching signal via a further inverter.

11. A circuit as claimed in claim 10, characterised in that the circuit between the input for the switching signal and the set input of each latching circuit (22', 23') includes delay means (I32, I33, I34, I35).

12. A circuit as claimed in claim 11, characterised in that the delay means comprises one or more inverter circuits.

13. A circuit as claimed in any one of claims 10 to 12, characterised in that the circuit between the input for the switching signal and each of the set and reset inputs of the latching circuits (22', 23') includes a differentiating circuit.

14. A circuit as claimed in claim 13, characterised in that the control circuit comprises a first transistor (T21) of one polarity type which has its emitter electrode coupled via the capacitor (C2') to the bridge output, its collector electrode coupled to one logic voltage line (0 V), its base electrode coupled to its emitter electrode via a resistor and also to the emitter of a second transistor (T22) of said one polarity type the base electrode of which is coupled to said one logic voltage line and the collector of which is coupled via a resistor to a second logic voltage line (5 V) and provides a first output indicative of direction of current through the capacitor (C2'), a third transistor (T23) of opposite polarity type which has its collector electrode coupled to said one logic voltage line (0 V) its base electrode coupled to said one logic voltage line (0 V) by a diode (T24) and its emitter electrode coupled to the bridge output via the capacitor C2' and also to the base electrode of a fourth transistor (T26) of said one polarity type via a resistor (R23) the base electrode of the fourth transistor is coupled with said one logic voltage line via a diode (T25) and the collector electrode of the fourth transistor (T26) is coupled via a resistor (R24) to said second logic voltage line (5 V) and provides a second output indicative of direction of current through the capacitor (C2'), the output of which second and fourth transistors are each coupled to the second input of a different one of the NAND gates (N1, N2).

15. A circuit as claimed in claim 14, characterised in that the inputs of the latching circuits (23', 22') which are coupled with the output of the first and second NAND gates (N2, N1) are preceeded by an inverter (I36, I39) whilst the other inputs to the latching circuits are coupled via third and fourth dual input NAND gates (N4, N3), the other input of which third and fourth gates are coupled with the output of a different one of said second and fourth transistors (T22, T26).

16. A circuit as claimed in claim 15, characterised in that each of the first and second NAND gates (N2, N1) has a third input which is coupled to the input for the switching signal, the first of which NAND gates (N2) is coupled therewith via the inverter (I31).

17. A circuit as claimed in claim 16, characterised in that each of the NAND gates (N2, N1) has a fourth input which is coupled with said circuit between the input for the switching signal and the set input of the latching means of the other NAND gate (N1, N2).

18. A circuit as claimed in claim 14, characterised in that the set and reset inputs of the latching circuits (23', 22') are each preceded by an inverter (I36, I37, I38, I39).

19. A circuit as claimed in claim 18, characterised in that it is fabricated on a single integrated circuit chip.

20. An a.c. powered switched bridge circuit, characterised in the combination of a voltage clamp (21) coupled in parallel with a pair of input lines for a source of alternating current supply, a rectifier circuit (22) coupled with the output of the voltage clamp and a switched bridge circuit (20) as claimed in any one of the preceding claims coupled with the output of the rectifier circuit.

21. A fluorescent lamp unit, characterised in the combination of a fluorescent tube (10) and ballast and an a.c. powered switched bridge circuit as claimed in claim 20 the bridge circuit of which is configured as a switched mode power converter which feeds the tube and ballast.

22. A fluorescent lamp unit as claimed in claim 21, characterised in that the voltage clamp (21), the rectifier circuit (22), the switched bridge circuit (20), the tube (10) and ballast are all incorporated in a housing.

23. A fluorescent lamp unit as claimed in claim 22, characterised in that the voltage clamp (21), the rectifier circuit (23) the switched bridge circuit (20) and the ballast are all incorporated in a luminaire for receiving a miniature fluorescent tube (10).

24. A fluorescent lamp unit as claimed in claim 23, characterised in that the lamp unit is adapted for removeable connection to a lamp socket such as is suitable for connection of an incandescent light bulb.

* * * * *